United States Patent

Park

[11] Patent Number: 6,159,820
[45] Date of Patent: Dec. 12, 2000

[54] METHOD FOR FABRICATING A DRAM CELL CAPACITOR

[75] Inventor: Byung-Jung Park, Kyunggi-do, Rep. of Korea

[73] Assignee: Samsung Electronics Co., Ltd., Rep. of Korea

[21] Appl. No.: 09/281,023

[22] Filed: Mar. 30, 1999

[30] Foreign Application Priority Data

Mar. 30, 1998 [KR] Rep. of Korea ...................... 98-10990

[51] Int. Cl.[7] .................................................. H01L 21/20
[52] U.S. Cl. .......................... 438/396; 438/399; 438/694
[58] Field of Search ................................... 438/698, 694, 438/699, 700, 702, 704, 706, 717, 253–256, 381, 396–399

[56] References Cited

U.S. PATENT DOCUMENTS

| 5,384,287 | 1/1995 | Fukase | 437/228 |
|---|---|---|---|
| 5,498,889 | 3/1996 | Hayden | 257/301 |
| 5,534,463 | 7/1996 | Lee et al. | 437/195 |
| 5,543,345 | 8/1996 | Liaw et al. | 437/52 |
| 5,550,071 | 8/1996 | Ryou | 437/41 |
| 5,554,557 | 9/1996 | Koh | 437/52 |
| 5,670,404 | 9/1997 | Dai | 437/52 |
| 5,710,073 | 1/1998 | Jeng et al. | 438/239 |
| 5,834,847 | 11/1998 | Jung et al. | 257/773 |
| 5,918,120 | 6/1999 | Huang | 438/239 |
| 5,956,594 | 9/1999 | Yang et al. | 438/396 |

Primary Examiner—Benjamin L. Utech
Assistant Examiner—Kin-Chan Chen
Attorney, Agent, or Firm—Myers Bigel Sibley & Sajovec

[57] ABSTRACT

Disclosed is an improved method for fabricating a DRAM cell capacitor which can provide a self aligned contact hole to a storage node of a capacitor and can increase capacitor surface areas by way of merging the contact hole forming step and the storage node forming step. The merging technique provides reduced photolithography process and thereby reduces processing cost. The method includes the steps of forming a first insulating layer over a semiconductor substrate having a plurality of gate electrode structures and a plurality of contact pads which is disposed between adjacent the gate electrode structures, the first insulating layer having a plurality of bit line structures therein; sequentially forming a first material layer, a second insulating layer, and a second material layer over the first insulating layer; forming a negative-type photoresist pattern over the second material layer; sequentially etching the second material layer, the second insulating layer, and the first material layer using the photoresist pattern as a mask and thereby forming a plurality of first openings; removing the photoresist pattern; forming a plurality of sidewalls spacers made of a first conductive material layer on the lateral edges of the first openings, the conductive sidewalls spacers having etch selectivity with respect to the first insulating layer; etching the first insulating layer between adjacent the plurality of the conductive sidewalls spacers and thereby forming self aligned a plurality of second openings to the contact pad; filling up the first openings and the second openings with a second conductive material layer; planarizing until a top surface of the second insulating layer is exposed; and etching the exposed second insulating layer using the first material layer as an etch stopper and thereby forming a plurality of storage nodes to the contact pads.

10 Claims, 14 Drawing Sheets

METHOD FOR FABRICATING A DRAM CELL CAPACITOR

FIELD OF THE INVENTION

The present invention relates to a method for fabricating a DRAM cell capacitor, and more particularly to a method for forming a self aligned storage node contact hole to the storage node.

BACKGROUND OF THE INVENTION

With the recent increase of integration density of a DRAM, a cell size and an area to be occupied by a capacitor of the DRAM cell tend to reduce, respectively. In order to keep a capacitance of such capacitor at an acceptable value, a stacked capacitor or a trench stacked capacitor has been used since it can provide a large capacitor area therein and it is capable of reducing interference between DRAM cells, and a variety of variation has been made to this basic stacked capacitor so as to increase the surface area. The widely adopted stacked capacitor includes for example cylindrical and fin type capacitor.

Generally, the stacked capacitor may be classified into COB(capacitor over bit line) structure and CUB(capacitor under bit line) structure from the fabrication sequence standpoint. The significant difference between them is the time when the capacitor is formed, i.e., after forming the bit line(COB) or before forming the bit line(CUB).

However, the conventional process for a DRAM capacitor with COB structure has some drawbacks in very high density devices such as Giga bit scale DRAM with 0.30 pitch application. For example, a sub-quarter micron resist pattern and high aspect ratio contact hole etching is significant obstacle to conventional photolithography technique and thereby deteriorating photo pattern and uniformity and reducing misalignment margin between storage node contact hole and storage node, and in severe case the short between the bit line and storage node contact hole may arise.

SUMMARY OF THE INVENTION

The present invention was made in view of the above problem, and it is therefore an object of the invention to provide a method for fabricating a DRAM cell capacitor which can prevent misalignment between storage node contact hole and storage node by way forming a self aligned storage node contact hole to the storage node.

It is a further object of the invention to provide a method for fabricating a DRAM cell capacitor which can easily form high aspect ratio contact hole and thereby increase process misalignment margin between the bit line and the contact hole.

To achieve these and other advantages and in accordance with the purpose of the present invention, the present invention includes forming transfer gate transistor structures on a predetermined region of a semiconductor substrate and passivated with an insulating layer such as silicon nitride layer cap and silicon nitride sidewall spacers. A plurality of contact pads to bit line and storage node are formed between the predetermined adjacent gate electrode structures. A first insulating layer is deposited and followed by the creation of bit line contact holes formed in the first insulating layer. A first conductive layer is deposited in the contact holes and over the first insulating layer and patterned to form bit line structures. A planar second insulating layer is formed over the bit line structures. A first material layer, a third insulating layer, and a second material layer are deposited over the second insulating layer in succession. The first and second material layers have an etch selectivity with respect to the second and third insulating layers respectively and selected from silicon nitride layer and polysilicon layer respectively in case that the insulating layers are oxide layers. Herein the third insulating layer is deposited to a thickness determining the height of the capacitor, for example about 10,000 Å to 11,000 Å, and the first material layer is about 500 Å, the second material layer is about 1500 Å to 2000 Å.

A negative-type photoresist pattern(i.e., reverse pattern) is formed over the second material layer to define storage node contacts holes and storage node. The second material layer, the third insulating layer, and the first material layer are sequentially etched using the photoresist pattern as a mask and thereby to form a plurality of first openings. Herein, the first openings are formed by etching selectively third insulating layer to the second material layer and thereby to prevent the opening from increasing. After removing the photoresist pattern, a second conductive layer is deposited over the semiconductor substrate to a thickness of about 300Å and anisotropically etched to form sidewalls spacers on lateral edges of the first openings. It must be noted that this sidewall spacer is provided to prevent short between the bit line and subsequent second openings(i.e., storage node contact holes), and the storage node contact holes are opened in the second and first insulating layer in a self aligned manner to this sidewalls spacers of the first openings using the sidewalls spacers as a mask. A third conductive layer is deposited in the first openings and second openings and planarized by CMP or etch-back. The third insulating layer is then selectively etched and thereby to form storage nodes. In this etching step, the first material layer serves as etch stopper. Subsequently, the first material layer is removed between adjacent storage nodes. Alternatively, the storage node sidewalls spacers may be formed to increase the surface areas of the capacitor. After that, there are followed by the conventional process sequences for forming the capacitor and metal interconnections.

It is advantages of the present invention that the storage node contact holes are formed in a self aligned manner to the storage node and thereby the small size contact holes can be formed easily without misalignment to bit line.

BRIEF DESCRIPTION OF THE DRAWINGS

The invention may be understood and its objects will become apparent to those skilled in the art by reference to the accompanying drawings as follows.

DETAILED DESCRIPTION OF THE PREFERRED EMBODIMENTS

Now in keeping with the objects of the invention, the method for fabricating a DRAM cell capacitor is covered in detail. This capacitor can be fabricated on a metal oxide semiconductor field effect transistor that are currently used in the manufacture of DRAMs. Therefore, only those details of the underlying structure will be described that are necessary for understanding the current invention.

FIGS. 1A, 1B, 1C, 1D, 1E, 1F and 1G show, at selected stages of fabrication, the cross-sections of a DRAM cell capacitor taken along bit line direction in accordance with a preferred embodiment of the present invention and FIGS. 2A, 2B, 2C, 2D, 2E, 2F, and 2G show, at selected stages of fabrication, the cross-sections of a DRAM cell capacitor taken along word line direction in accordance with a preferred embodiment of the present invention shown in FIG. 1A to FIG. 1G, and in FIG. 2, the same parts function as shown in FIG. 1 are identified with same reference numbers and their explanation are omitted.

Figure 1A:
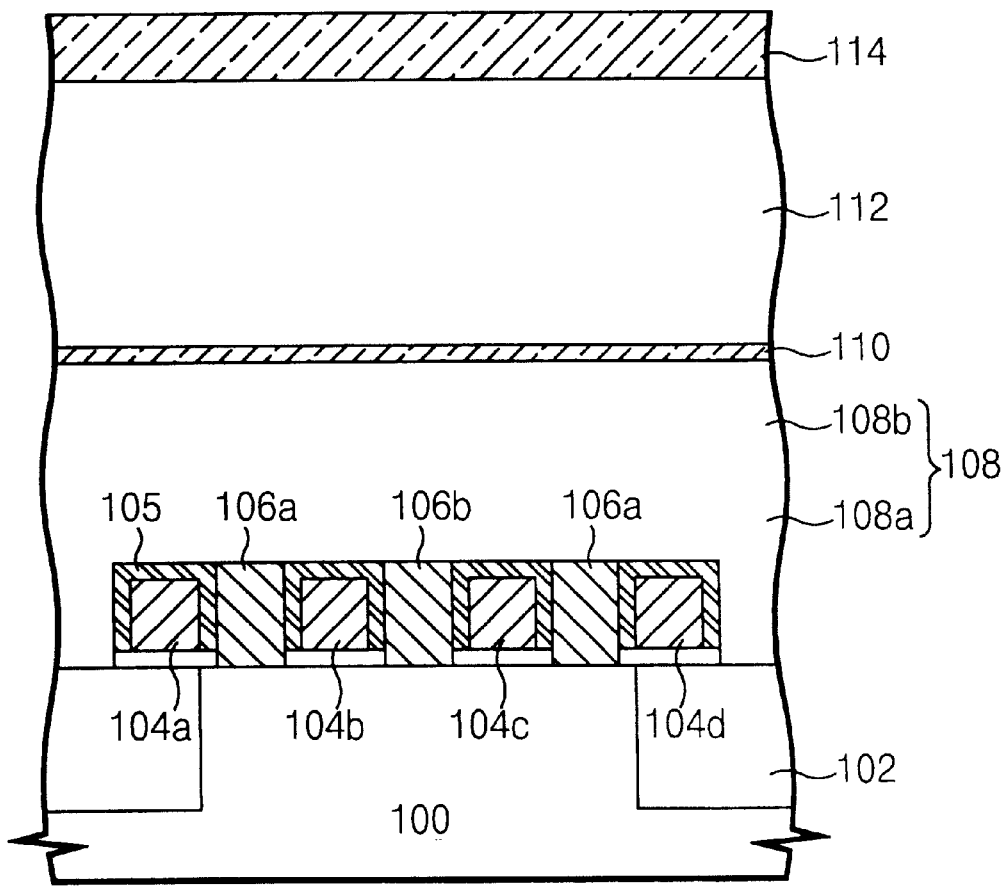
FIGS. 1A, 1B, 1C, 1D, 1E, 1F, and 1G show, at selected stages of fabrication, the cross-sections of a DRAM cell capacitor taken along bit line direction in accordance with a preferred embodiment of the present invention.
Figure 2A:
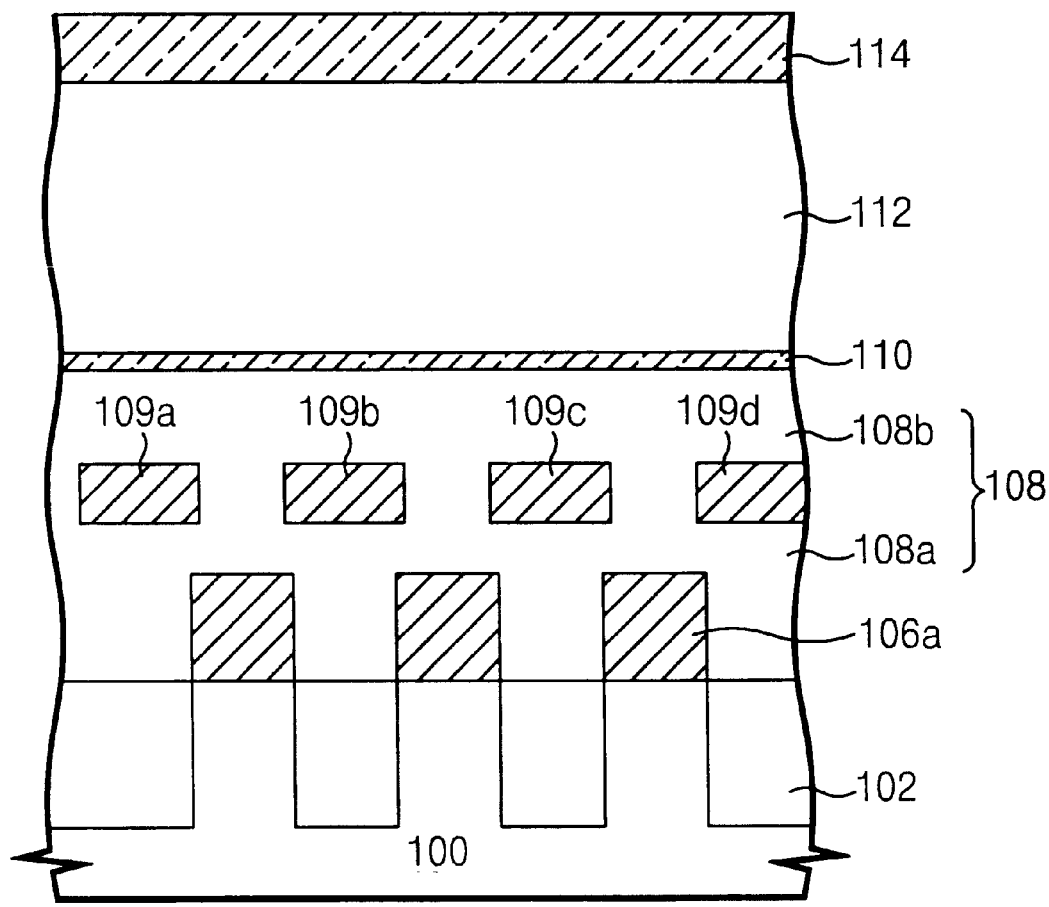
FIGS. 2A, 2B, 2C, 2D, 2E, 2F, and 2G show, at selected stages of fabrication, the cross-sections of a DRAM cell capacitor taken along word line direction in accordance with a preferred embodiment of the present invention shown in FIGS. 1A, 1B, 1C, 1D, 1E, 1F, and 1G.

Referring now to FIG. 1A and FIG. 2A, a field oxide layer 102 is formed by conventional technique such as local oxidation of silicon(LOCOS) or trench isolation so as to define an active region and an inactive region on a semiconductor substrate 100. A plurality of gate electrode structures 104a, 104b, 104c, and 104d are formed at a predetermined region of the semiconductor substrate 100. As is known in the art, a gate oxide layer is disposed between the gate electrode structures 104a to 104d and the semiconductor substrate 100 and passivated with an insulating layer such as silicon nitride layer cap and silicon nitride sidewall spacers 105. A plurality of contact pads 106a and 106b to storage nodes and bit lines are formed at predetermined regions between adjacent gate electrode structures 104a to 104d.

A first planar insulating layer 108 is formed over the resulting structure. As can be seen in FIG. 2A, a plurality of bit line structures 109a, 109b, 109c, and 109d are formed therein. Briefly, a first oxide layer 108a is formed over the gate electrode structures 104a to 104d and over the contact pads 106a and 106b. Bit line contact holes(not shown) are opened in the first oxide layer and filled with a conductive layer, and patterned to form the bit line structures 109a to 109d. A second oxide layer is formed over the bit line structures 109a to 109d and over the first oxide layer 108a and planarized.

A first material layer 110, a second insulating layer 112, and a second material layer 114 are deposited over the first insulating layer 108 in succession. The first and second material layers 110 and 114 have an etch selectivity with respect to the first and second insulating layers 108 and 112, respectively and may be selected from silicon nitride layer and polysilicon layer respectively in case that the insulating layers 108 and 102 are oxide layers. Herein the second insulating layer 112 is deposited to a thickness determining the height of the capacitor, for example about 10,000 Å to 11,000 Å, and the first material layer 110 is deposited to a thickness of about 500 Å, the second material layer 114 is deposited to a thickness of about 1500 Å to 2000 Å.

Figure 1B:
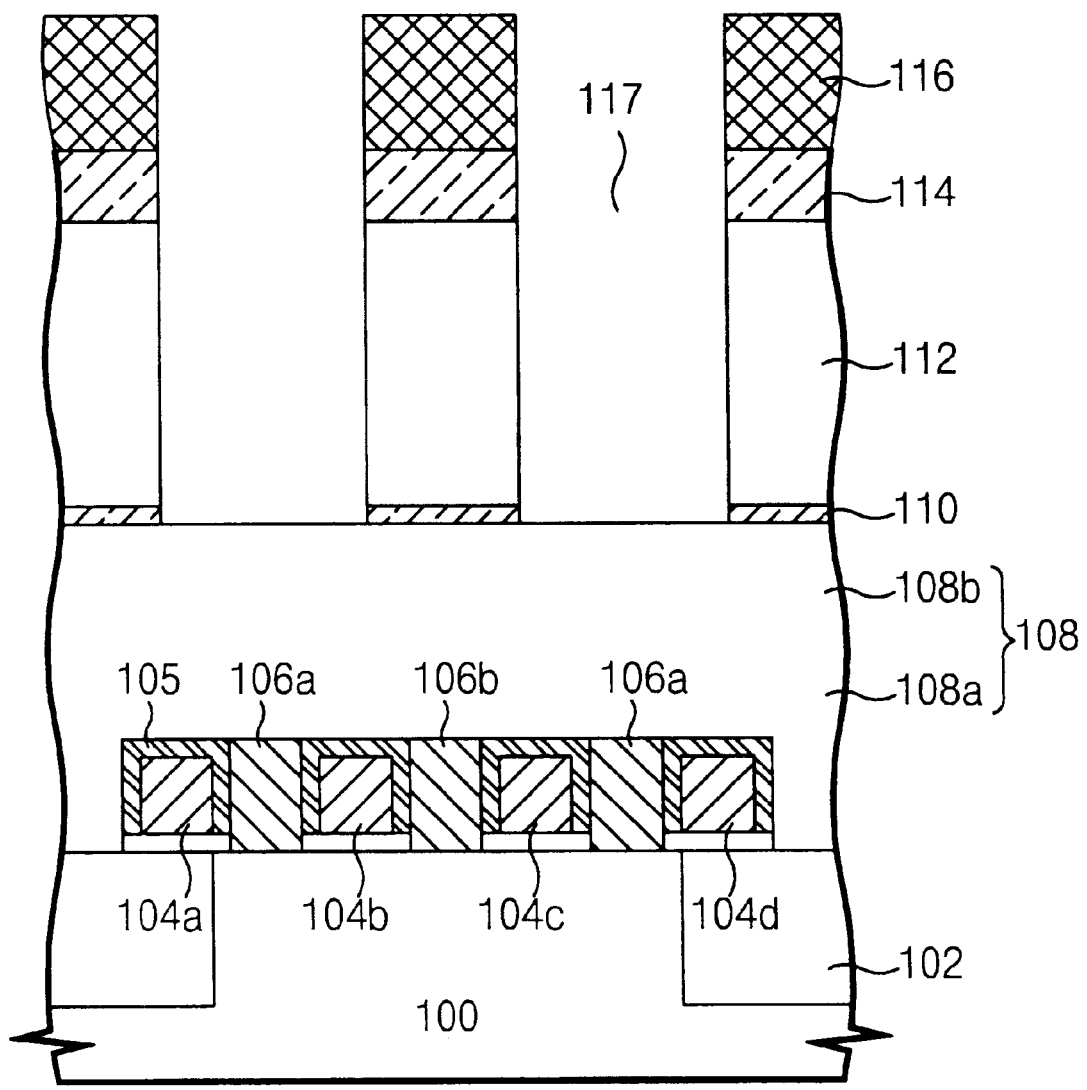
Figure 1C:
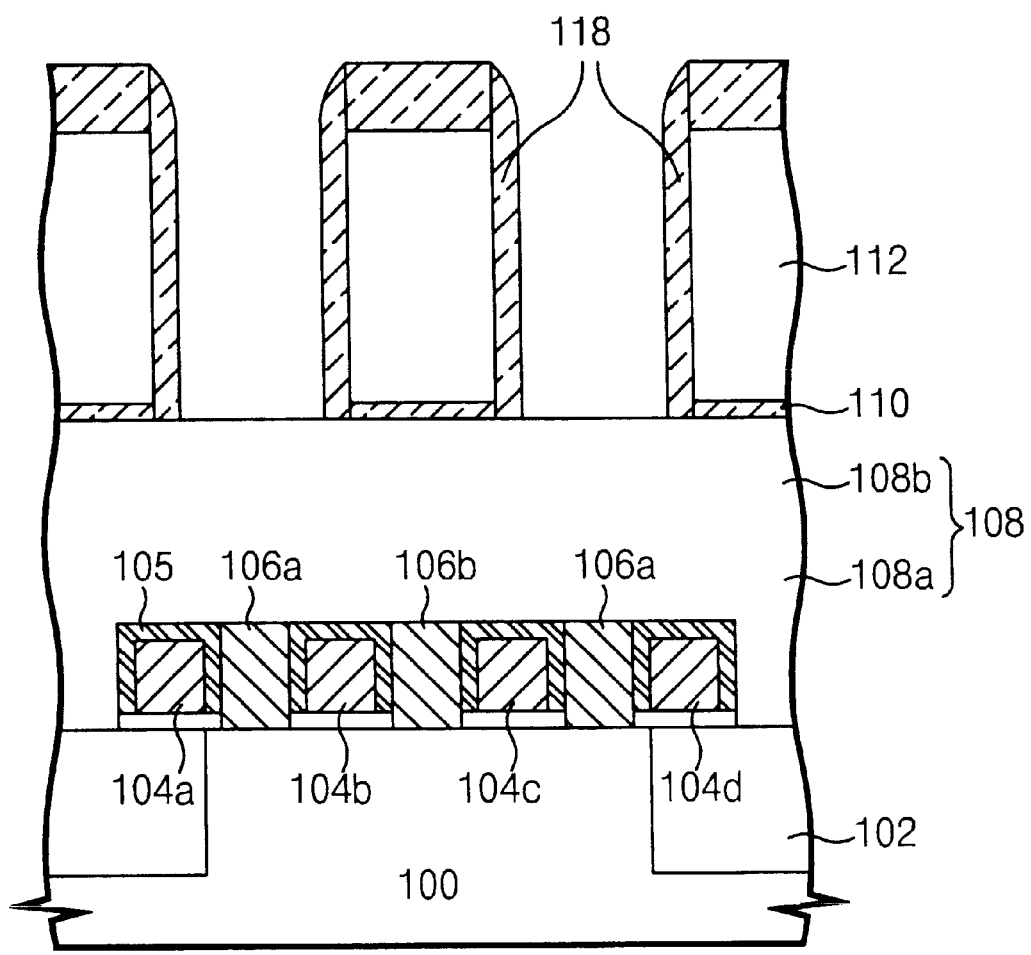
Figure 2B:
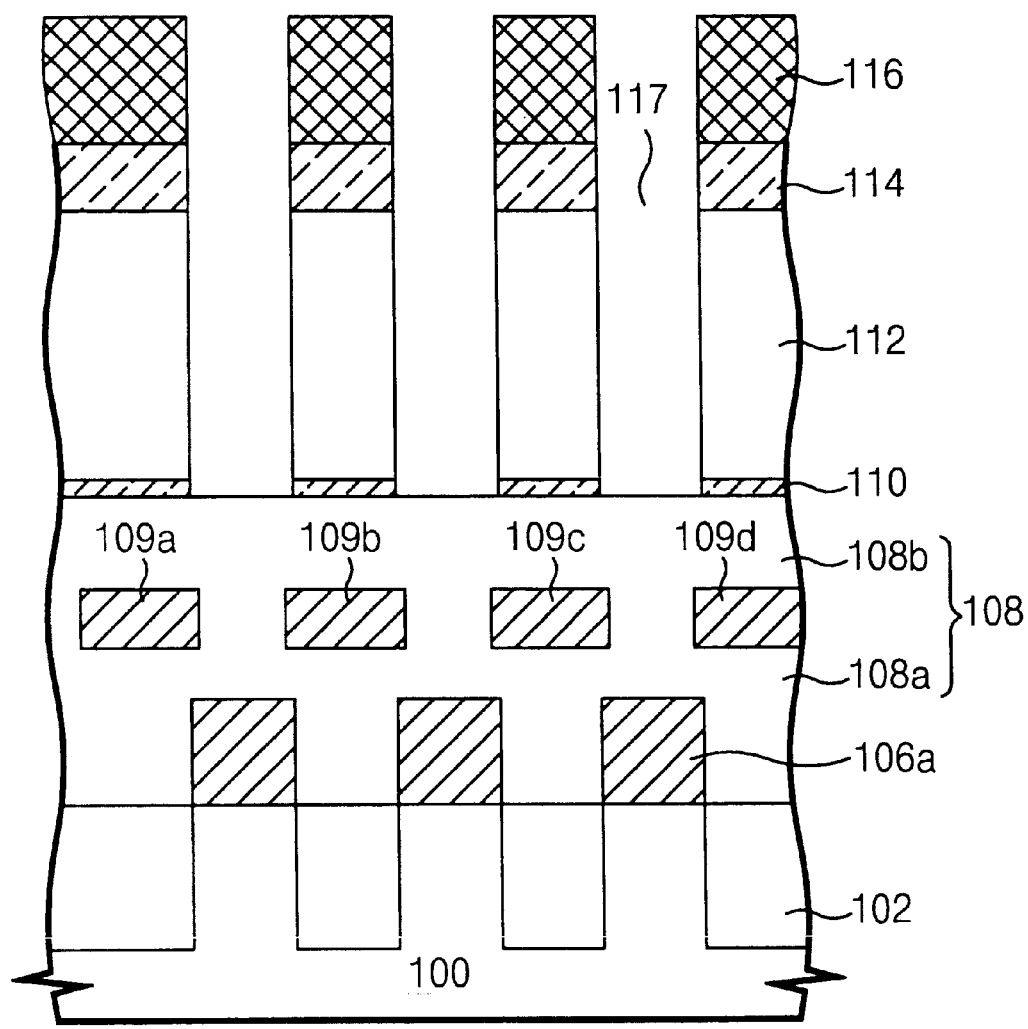
Figure 2C:
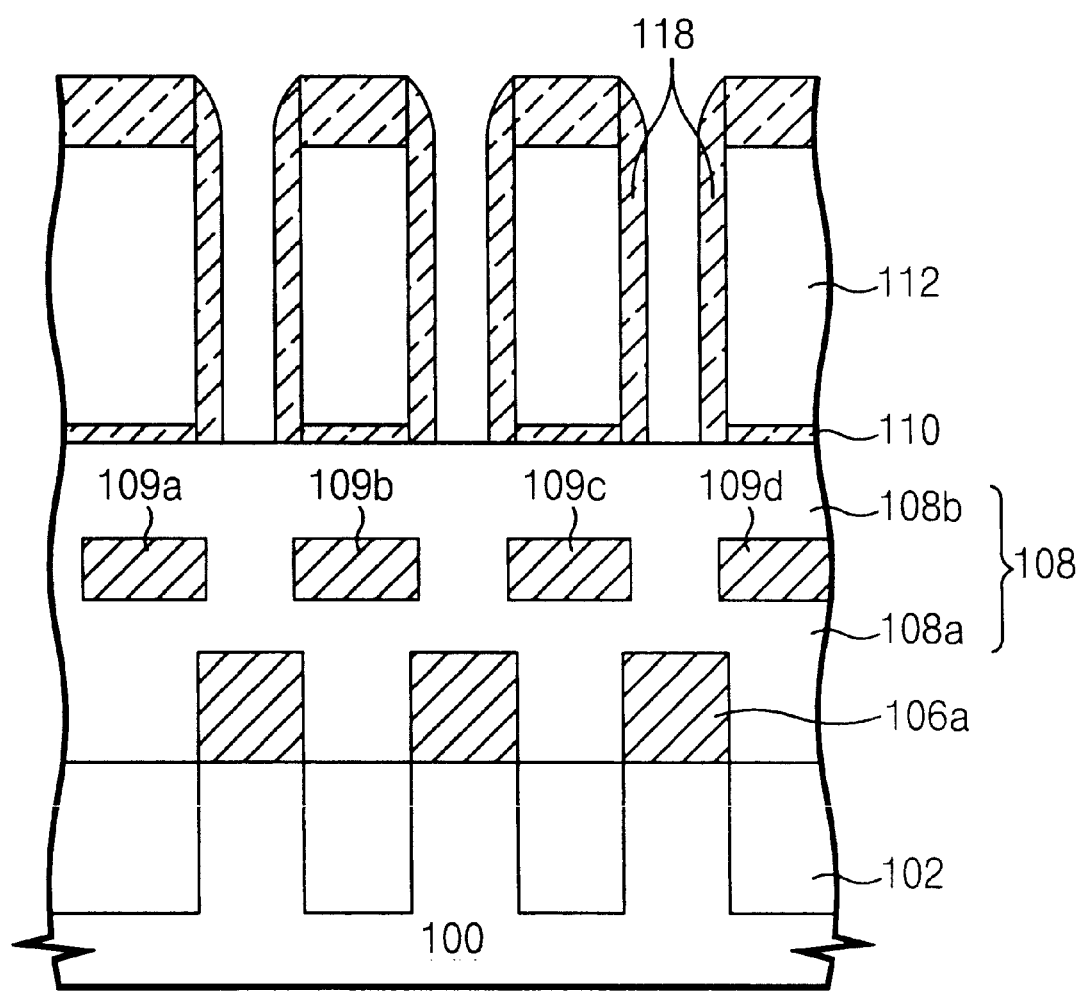

A reverse pattern 116 for storage node formation is formed over the second material layer 114 to define storage node contact holes and storage node. The reverse pattern 116 is for example negative-type photoresist pattern and the second material layer 114, the second insulating layer 112, and the first material layer 110 are sequentially etched using the photoresist pattern 116 as a mask and thereby to form a plurality of first openings 117 as shown in FIG. 1B and FIG. 2B. At this time, the first openings 117 are formed by etching selectively second insulating layer 112 to the second material layer 114 and thereby being able to prevent the opening size from increasing.

Figure 1D:
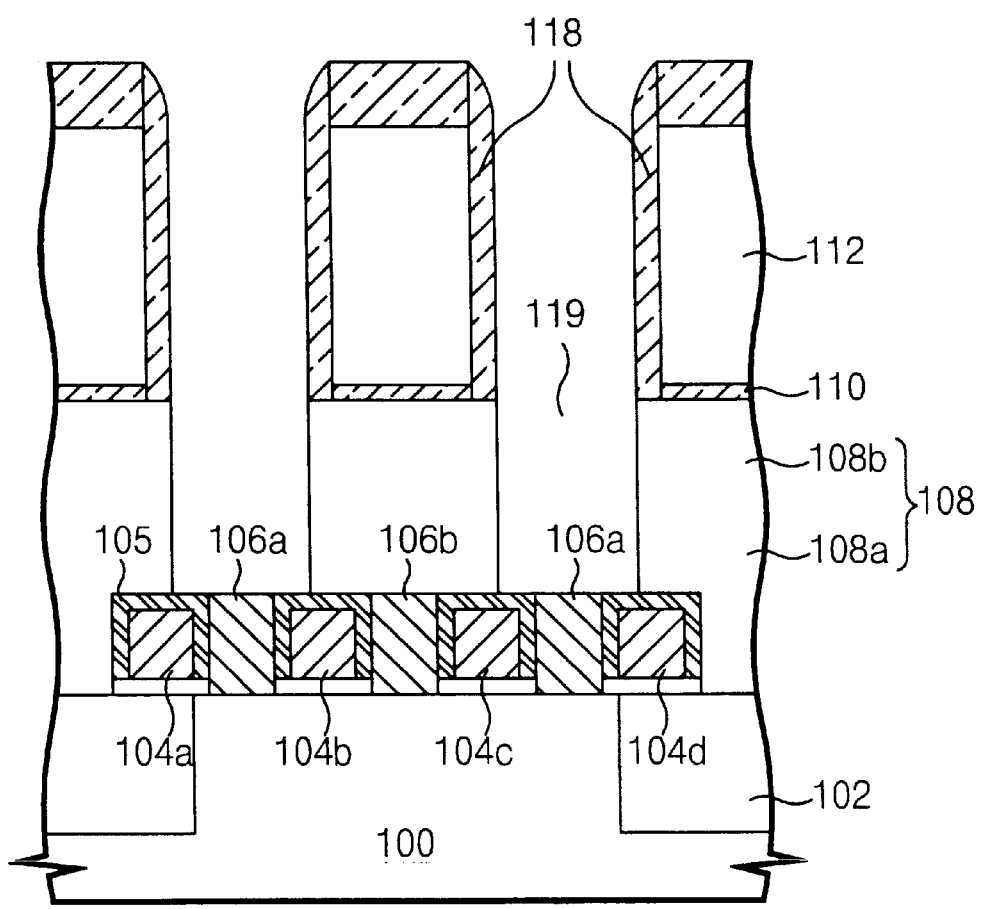
Figure 1E:
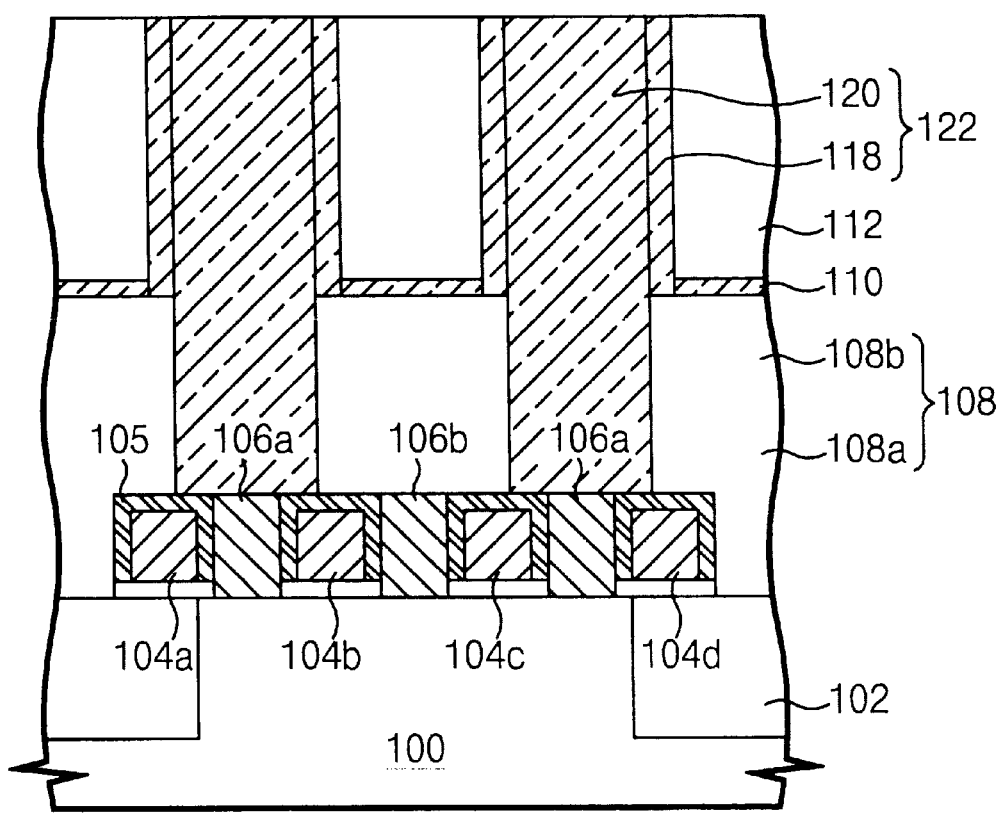
Figure 2D:
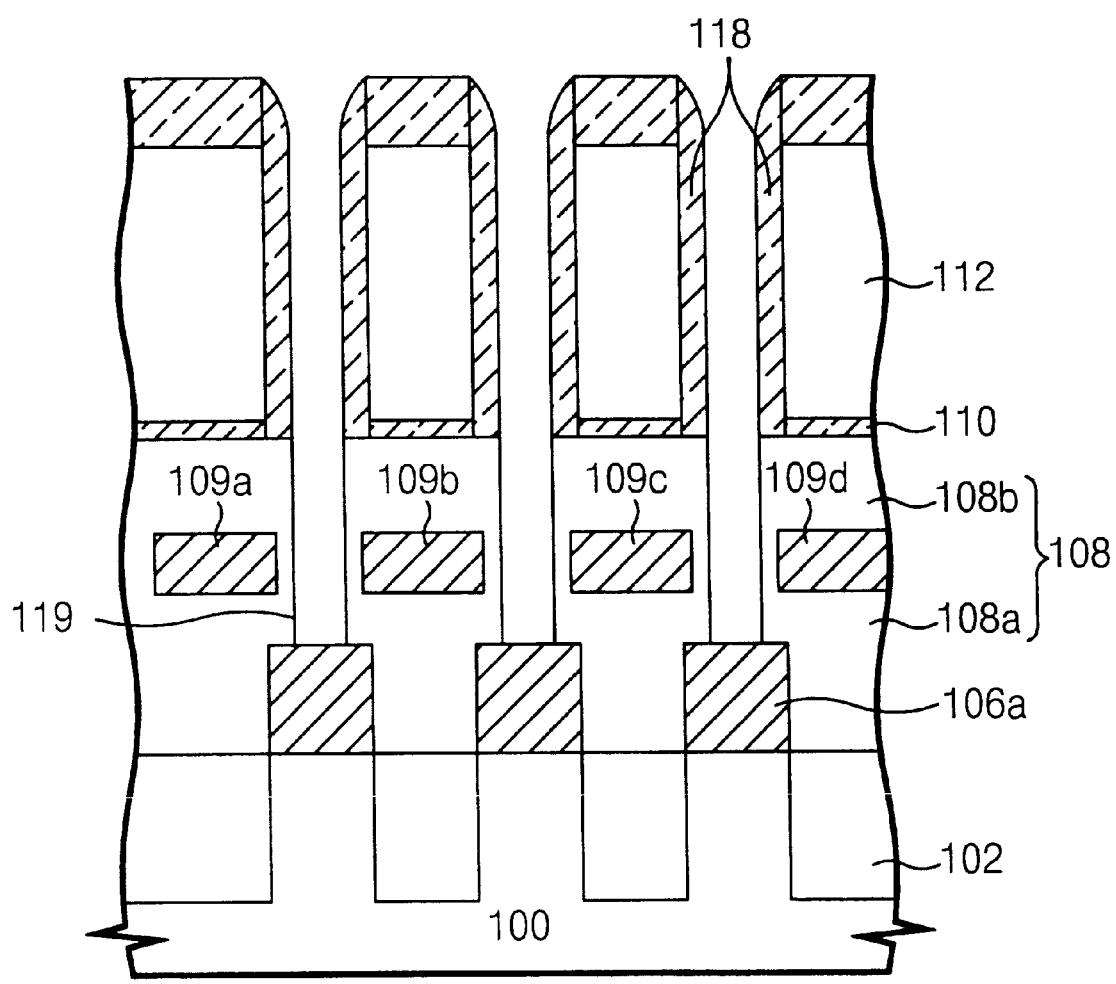
Figure 2E:
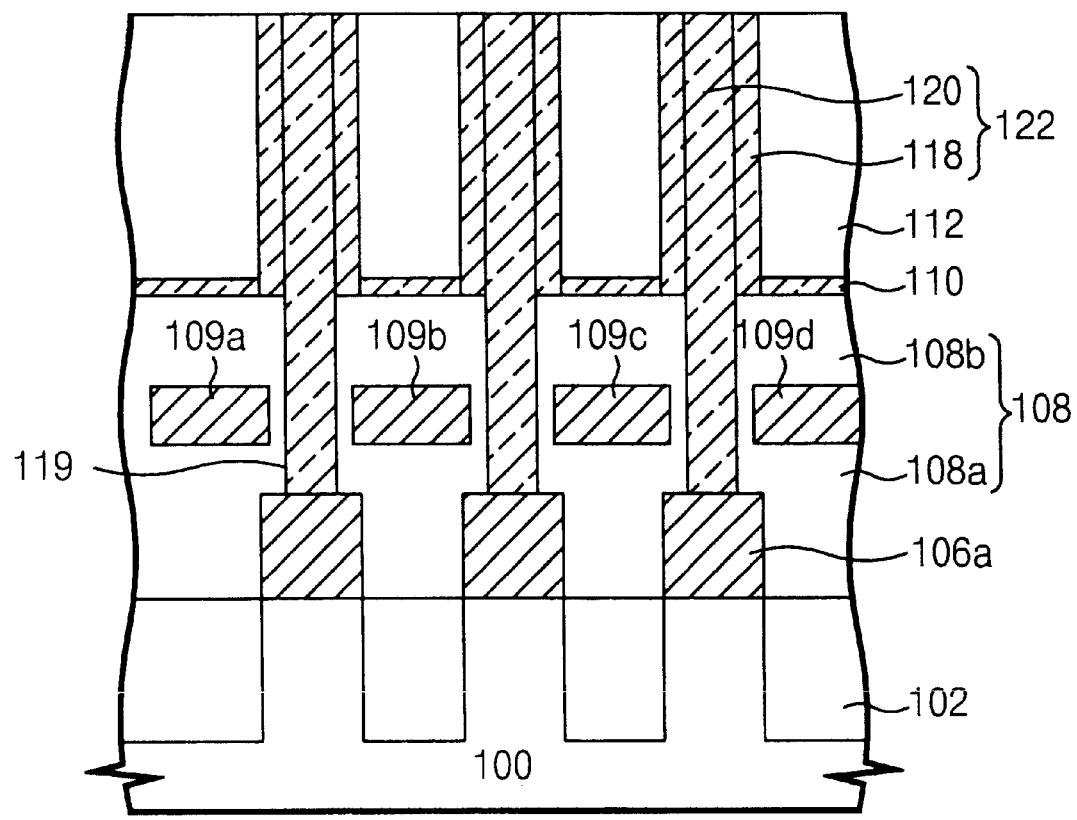

The formation of selfaligned storage node contact holes to the first openings 117 into which storage node conductive materials is to be deposited is next addressed, and shown schematically in FIG. 1C to 1D and FIG. 2C to 2D. After removing the photoresist pattern 116 using $O_2$-plasma ashing, a first conductive layer 118 is deposited over the resulting structure to a thickness of about 300 Å and anisotropically etched by etch-back technique to form sidewalls spacers 118 on lateral edges of the first openings 117. It must be noted that thus formed sidewalls spacers 118 are provided to prevent short between the bit line structures 109a to 109d and subsequent second openings 119 (i.e., storage node contact holes), and the storage node contact holes 119 are opened in the first insulating layer 108 in a self aligned manner to the sidewalls spacers 118 of the first openings 117 by using the sidewalls spacers 119 as an etching mask as shown in FIG. 1D and FIG. 2D. A second conductive layer 120 composed of polysilicon is deposited in the first openings 117 and second openings 119. After that planarization process is carried out down to a top surface of the second insulating layer 112 by CMP or etch-back technique as shown in FIG. 1E and FIG. 2E.

Figure 1F:
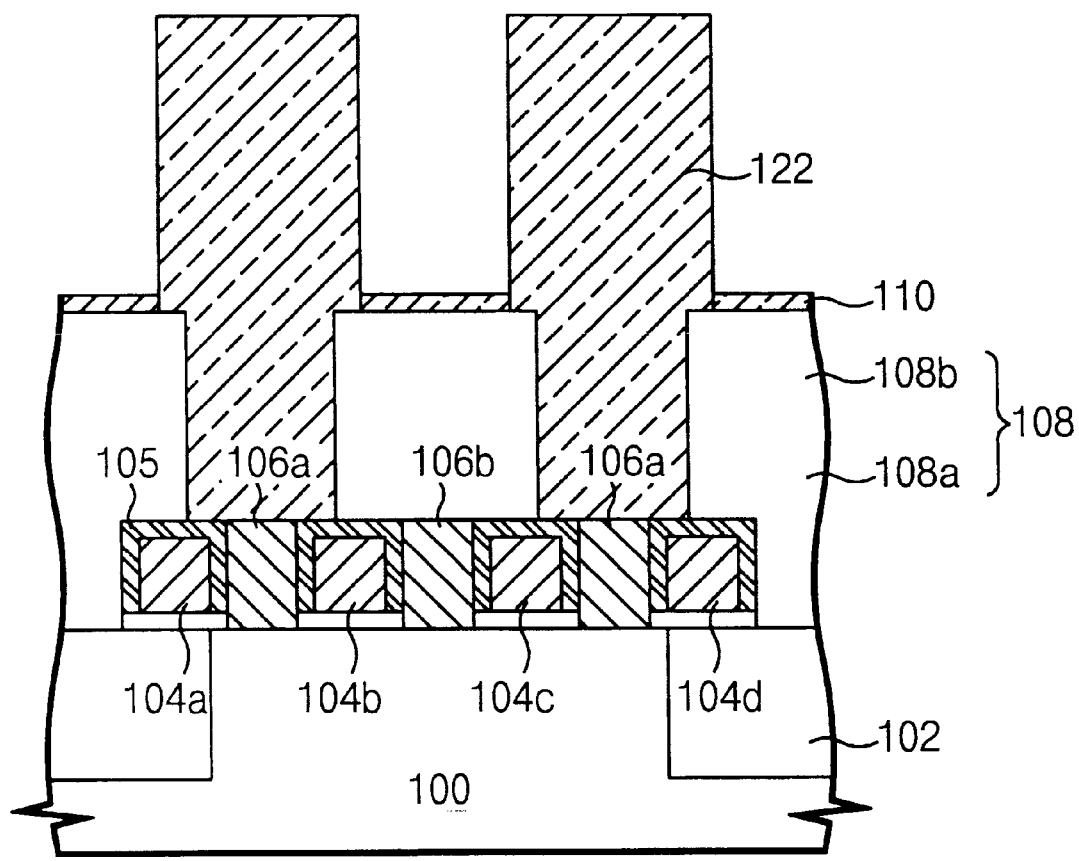
Figure 1G:
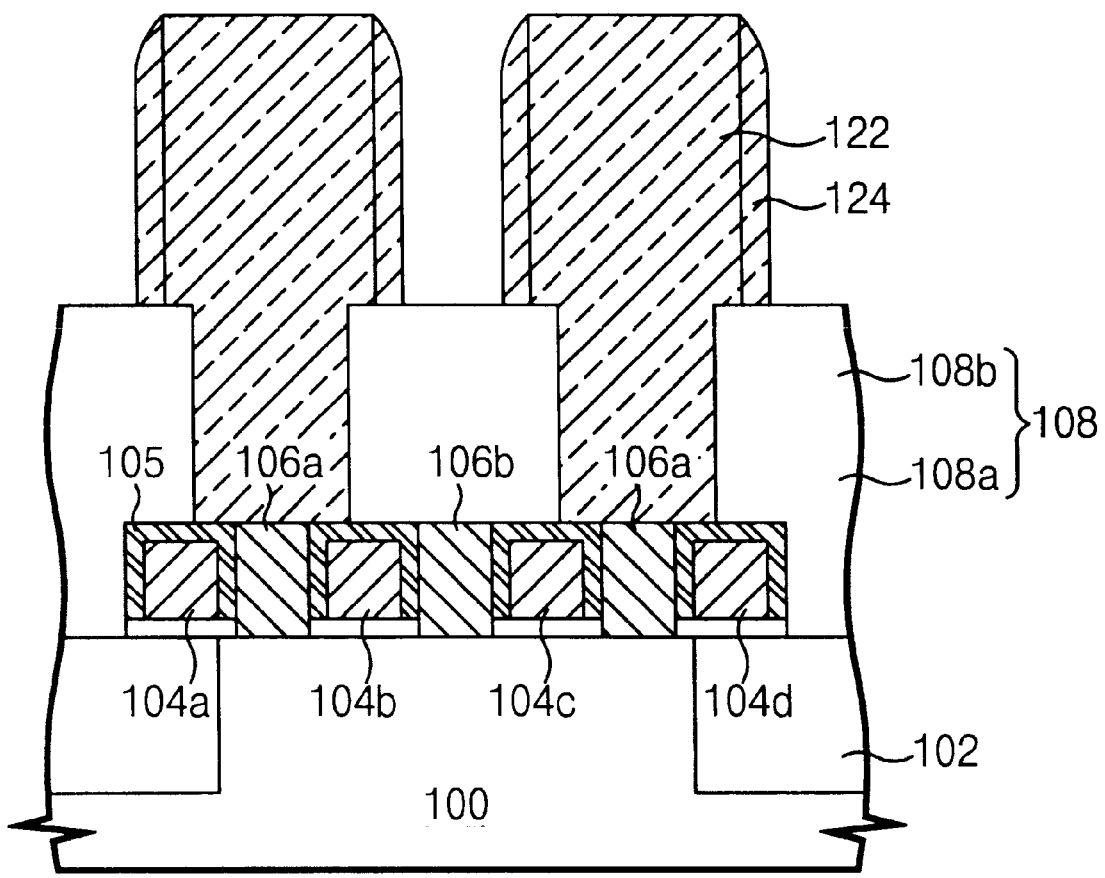
Figure 2F:
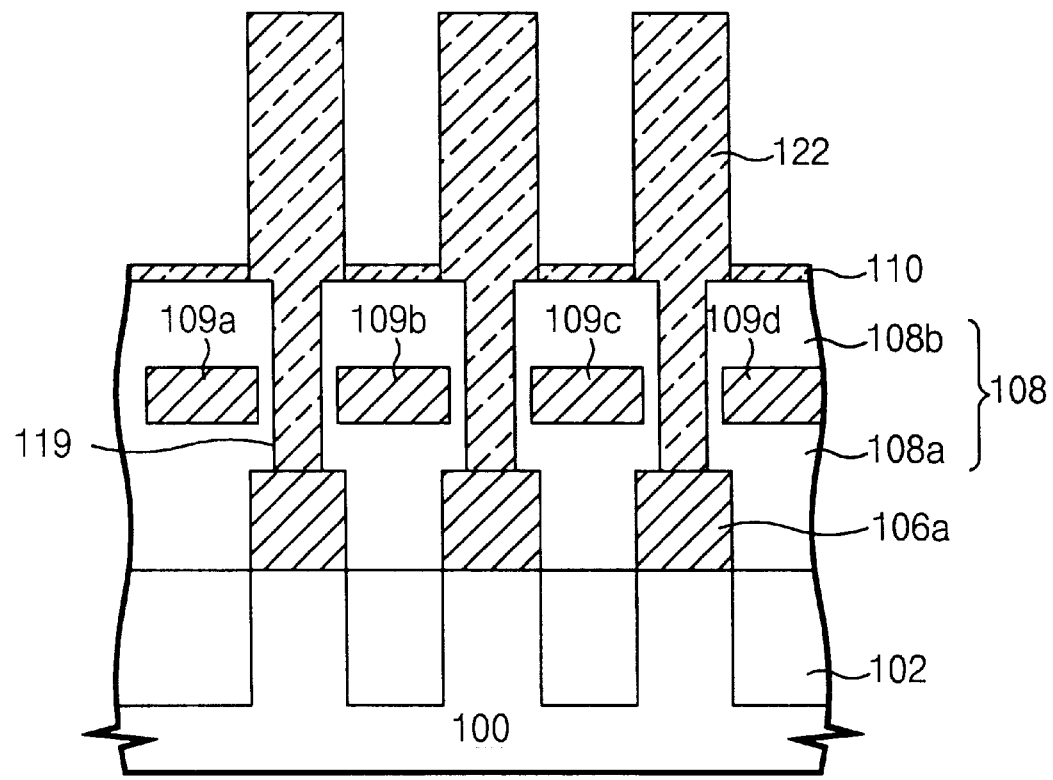

A plurality of storage nodes formation is next addressed, and shown schematically in FIGS. 1F to 1G and FIGS. 2F to 2G. Referring to FIG. 1F and FIG.2F, the second insulating layer 112 is etched for example wet etching until the top surface of the first material layer 110 is exposed and thereby to form a plurality of storage nodes 122. Accordingly, the storage nodes contact holes and the storage nodes are formed simultaneously in self aligned manner with respect to each other. After that, the first material layer 110 between adjacent storage nodes 122 may be removed. However, if the first material layer 110 is conductive material such as polysilicon, it must be removed in this step. If not conductive material, it 110 can be removed in subsequent process. The removal of the first material layer 110 may be carried out by etch-back technique.

Figure 2G:
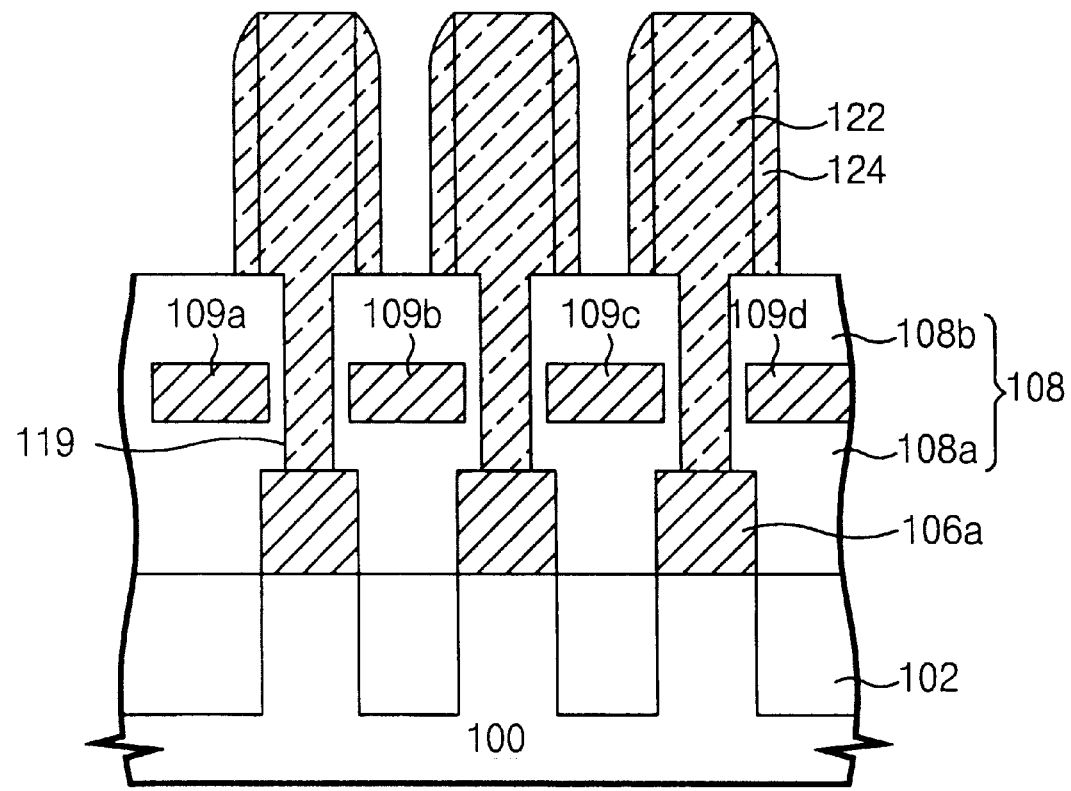

In order to increase the surface areas of the storage nodes, the sidewalls spacer formation on the lateral edges of the storage nodes is carried out. A third conductive layer is deposited over the resulting structure shown in FIG. 1F and FIG. 2F to a thickness of about 300 Å. An isotropic etch such as etch-back is carried out to form sidewalls spacers 124 and the first material layer between adjacent storage nodes 122 is removed at the same time as shown in FIG. 1G and FIG. 2G. This sidewalls spacers 124 also improves the step coverage during the subsequent step of depositing dielectric layer and plate electrode layer.

After that, conventional processes for depositing dielectric film, plate electrode and metal interconnections are carried out.

Alternatively, the spirit of this invention may be applied to a process for forming a landing pad over the contact hole.

While this invention has been particularly shown and described with reference to the preferred embodiments thereof, it will be understood by those skilled in the art that various changes in form and details may be made without departing from the spirit and scope of this invention.

What is claimed is:

1. A method for fabricating a capacitor over bit line(COB) structure for a DRAM cell, comprising the steps of:

forming a first insulating layer over a semiconductor substrate having a plurality of gate electrode structures and a plurality of contact pads which is disposed between adjacent said gate electrode structures, said first insulating layer having a plurality of bit line structures therein;

sequentially forming a first material layer, a second insulating layer, and a second material layer over said first insulating layer;

forming a reverse photoresist pattern over said second material layer;

sequentially etching said second material layer, said second insulating layer, and said first material layer using said photoresist pattern as a mask and thereby forming a plurality of first openings;

removing said photoresist pattern;

forming a plurality of sidewalls spacers made of a first conductive material layer on lateral edges of said first openings, said conductive sidewalls spacers having etch selectivity with respect to said first insulating layer;

etching said first insulating layer between adjacent said plurality of said conductive sidewalls spacers and thereby forming self aligned a plurality of second openings to said contact pad;

filling up said first openings and said second openings with a second conductive material layer;

planarizing until a top surface of said second insulating layer is exposed; and etching said exposed second insulating layer using said first material layer as an etch stopper and thereby forming a plurality of storage nodes to said contact pads.

2. The method according to claim 1, wherein said first and second material layers are respectively selected from the group consisting of a silicon nitride layer and a polysilicon layer.

3. The method according to claim 1, wherein said second insulating layer has a thickness of about 10,000 Å to 11,000 Å.

4. The method according to claim 1, wherein said first conductive material layer is deposited to a thickness of about 300 Å.

5. The method according to claim 1, wherein said step of planarizing is carried out using CMP or etch-back.

6. The method according to claim 1, further comprises, after etching said second insulating layer, etching exposed said first material layer between said storage nodes.

7. The method according to claim 6, wherein said step of etching exposed said first material layer is carried out using anisotropic etching.

8. The method according to claim 1, further comprises forming a plurality of electrically conductive sidewalls spacers on lateral edges of said storage nodes by depositing a third conductive material layer on said storage node and said first material layer, and anisotropically etching said third conductive layer and said first material layer until a top surface of said storage nodes and said first insulating layer is exposed.

9. The method according to claim 8, wherein said third conductive layer is deposited to a thickness of about 300 Å.

10. The method according to claim 8, wherein said sidewalls spacers are provided to increase surface areas of said storage nodes.

* * * * *